United States Patent [19]

Inoue et al.

[11] Patent Number: 5,253,140

[45] Date of Patent: Oct. 12, 1993

[54] CONNECTOR UNIT FOR INPUT/OUTPUT MODULE OF PROGRAMMABLE CONTROLLER HHAVING DISENGAGEMENT LEVER

[75] Inventors: Michiya Inoue, Hachioji; Takashi Yamauchi, Yamanashi, both of Japan

[73] Assignee: Fanuc Ltd., Minamitsuru, Japan

[21] Appl. No.: 774,523

[22] Filed: Oct. 8, 1991

Related U.S. Application Data

[63] Continuation-in-part of Ser. No. 432,739, Oct. 19, 1989, abandoned.

[30] Foreign Application Priority Data

Mar. 12, 1988 [JP] Japan .................................. 63-059163

[51] Int. Cl.[5] ...................... H05K 7/10; H01R 13/629; H01R 4/50
[52] U.S. Cl. ...................... 361/728; 439/157; 439/341; 439/483; 439/709; 16/115; 361/736; 361/823
[58] Field of Search ............... 439/142, 157, 159, 160, 439/341, 342, 709, 712, 476, 483, 484; 16/115, 124; 361/395, 400, 413, 426, 392

[56] References Cited

U.S. PATENT DOCUMENTS

| | | | |
|---|---|---|---|
| 3,992,654 | 11/1976 | Springer et al. | 361/415 |
| 4,070,081 | 1/1978 | Takahashi | 439/157 X |
| 4,151,580 | 4/1979 | Struger et al. | 361/415 |
| 4,197,572 | 4/1980 | Aimar | 439/160 X |
| 4,692,842 | 9/1987 | Joly et al. | 361/413 |
| 4,920,453 | 4/1990 | Onose et al. | 361/392 |
| 5,043,847 | 8/1991 | Deinhardt et al. | 361/395 |

FOREIGN PATENT DOCUMENTS

| | | |
|---|---|---|
| 1257680 | 7/1989 | Canada . |
| 119951 | 9/1984 | European Pat. Off. ............ 439/341 |
| 165434 | 5/1985 | European Pat. Off. . |
| 3634695 | 4/1988 | Fed. Rep. of Germany ...... 439/341 |
| 51-26682 | 7/1976 | Japan . |
| 56-109287 | 8/1981 | Japan . |
| 57-123670 | 8/1982 | Japan . |
| 59-10784 | 4/1984 | Japan . |

*Primary Examiner*—Leo P. Picard
*Assistant Examiner*—Michael W. Phillips
*Attorney, Agent, or Firm*—Staas & Halsey

[57] ABSTRACT

An I/O unit has a fixed unit such as a housing provided with a multiplicity of connection terminals and an LED display module unit. A mounting/dismounting unit is provided with a terminal block including connection terminals to be coupled with the connection terminals of the fixed unit. The mounting/dismounting unit has a hinge disposed at an end thereof and the fixed unit has a pin and a grip capable of being engaged with the hinge. The grip is pulled out to a position to be used and then further pulled out, whereby the mounting/dismounting unit is forced out, drawing an arc about the pin and separated from the fixed unit. With this arrangement, an I/O module with a mounting/dismounting unit capable of being easily removed is provided.

1 Claim, 8 Drawing Sheets

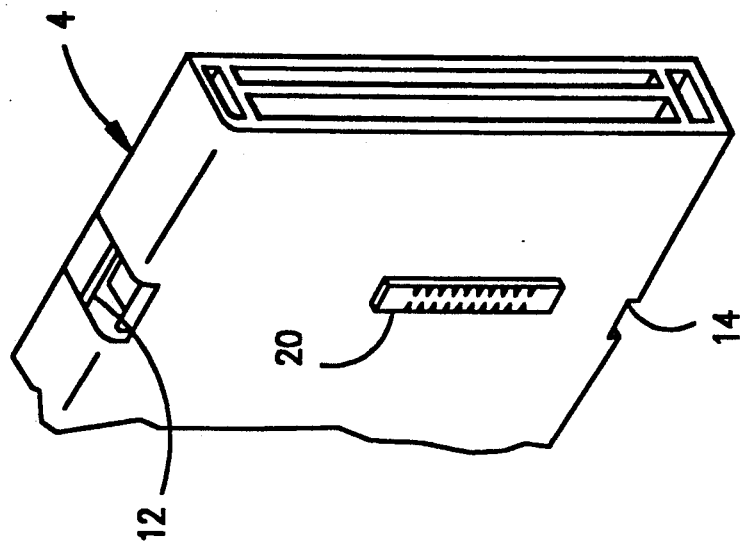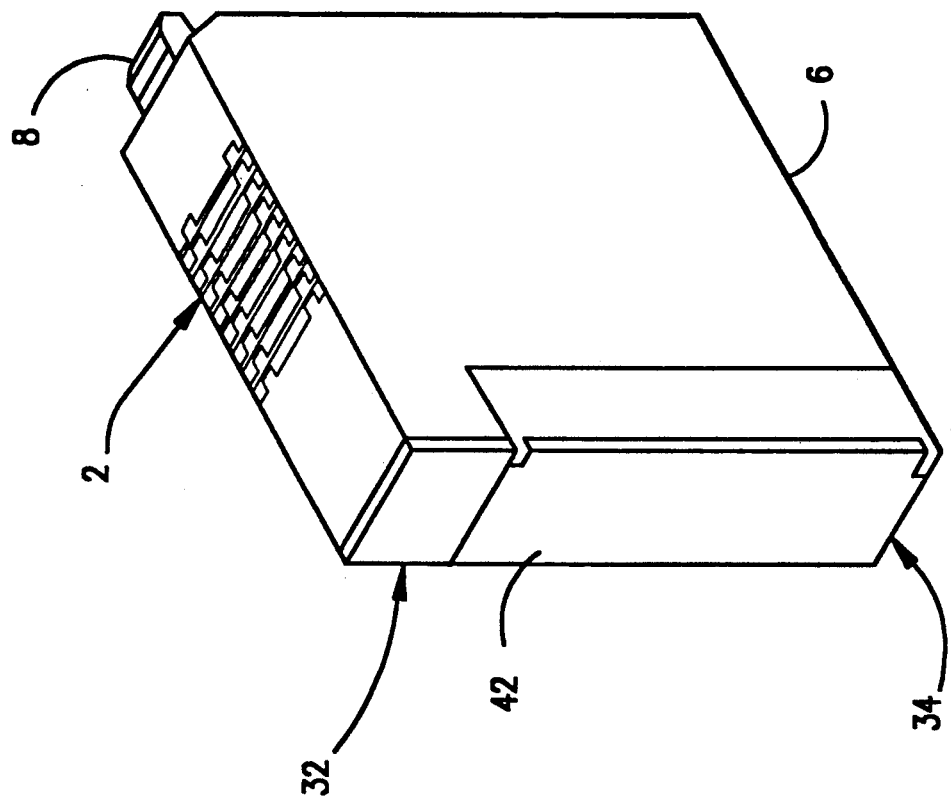
FIG. 1

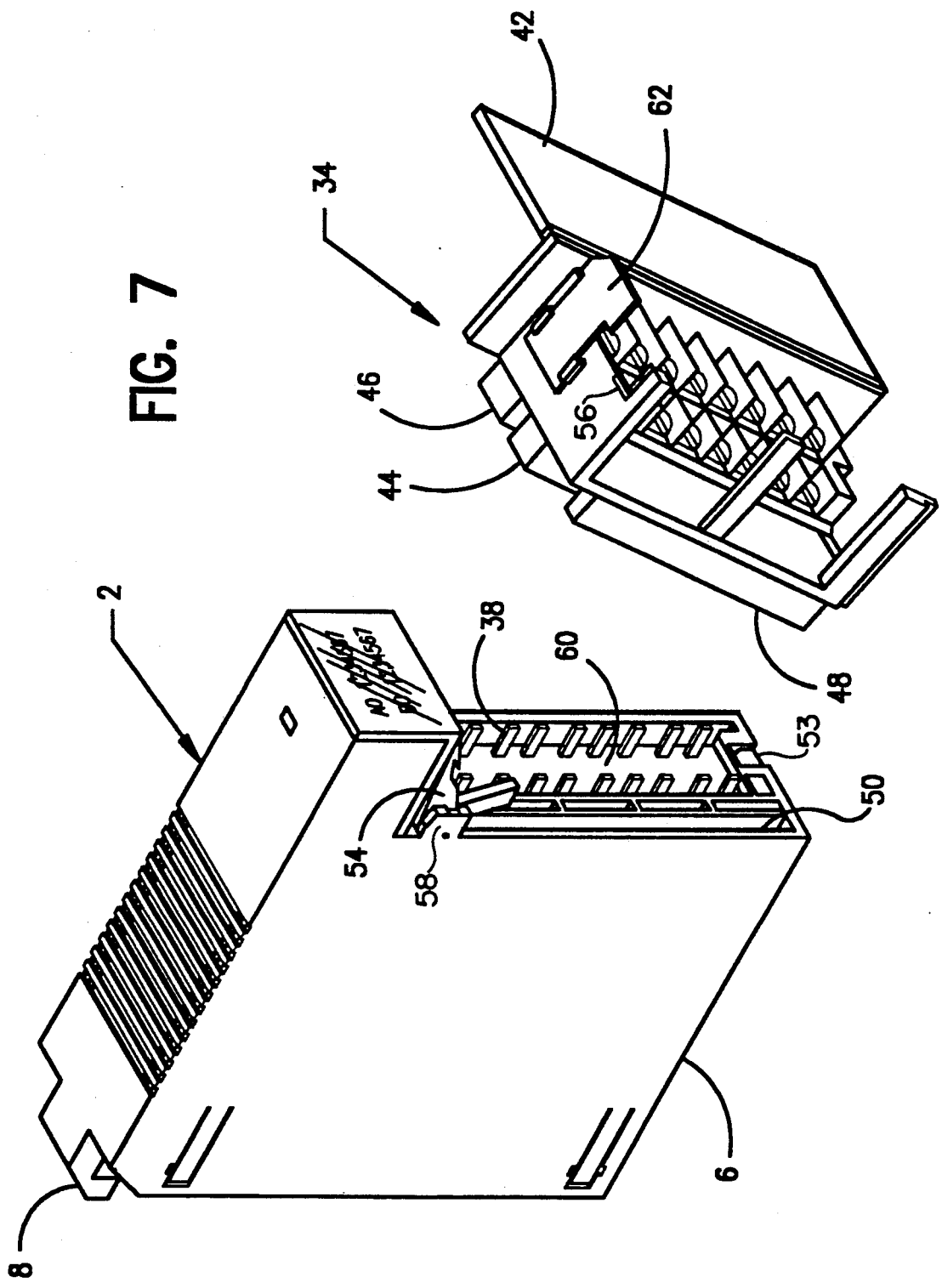

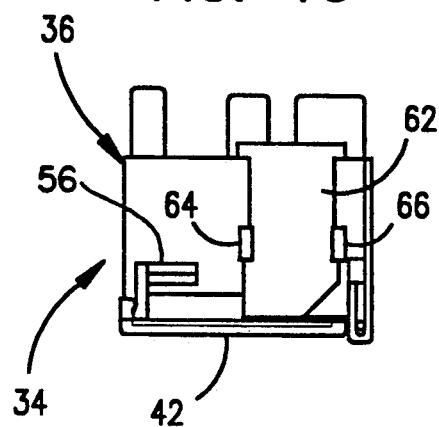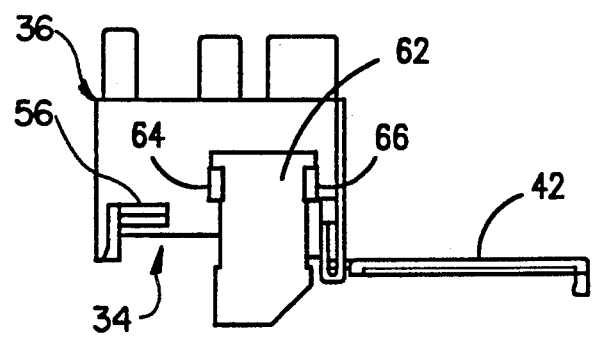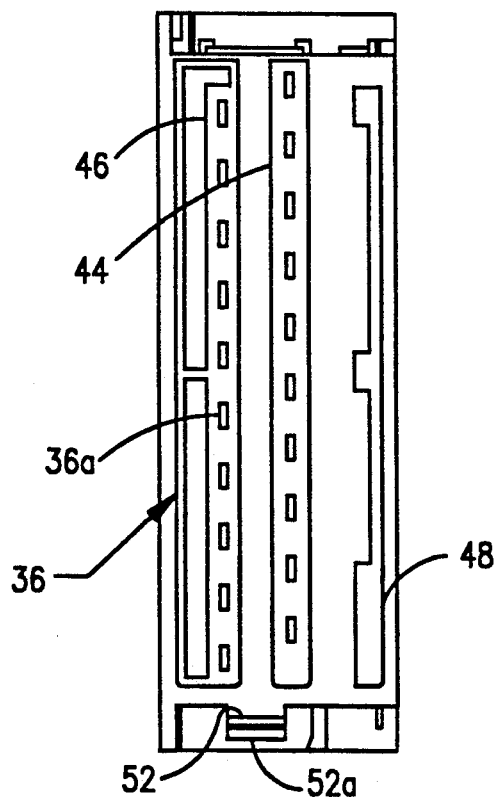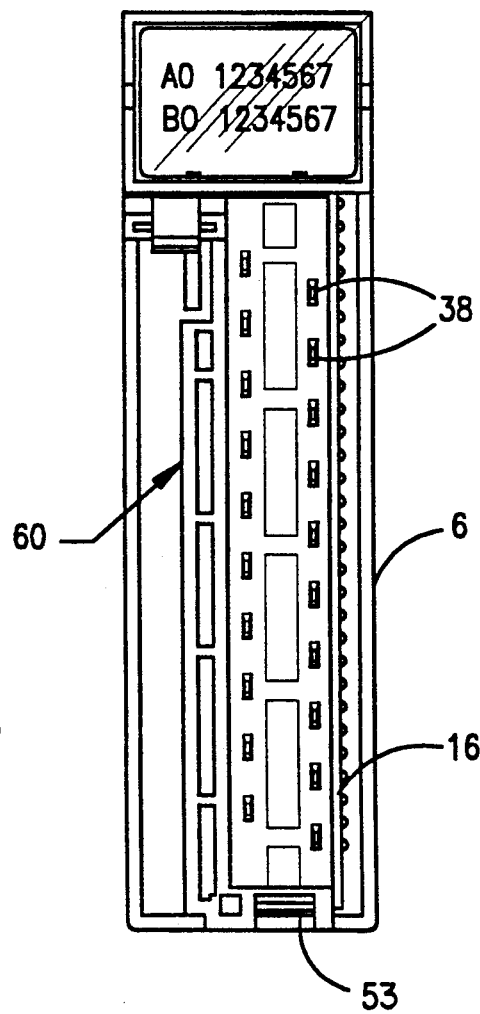

CONNECTOR UNIT FOR INPUT/OUTPUT MODULE OF PROGRAMMABLE CONTROLLER HHAVING DISENGAGEMENT LEVER

This is a continuation-in-part of U.S. Ser. No. 07/432,739, filed Oct. 19, 1989, which is now abandoned.

BACKGROUND OF THE INVENTION

1. Field of the Invention

The present invention relates to an input/output module (I/O module) for an electronic apparatus, and more specifically, to an I/O module for a programmable control device (PC).

2. Description of the Related Art

An I/O module for a PC uses a terminal block for connecting a plurality of input/output signals. Since this terminal block includes many wirings fixed by screws, it is usually arranged as a connector to be mounted and dismounted as a whole without removing the wirings to facilitate the replacement of a faulty I/O module. When this terminal block type connector is engaged, its receptacle must be strongly coupled with its plug. Thus, the opposite ends of the connector is conventionally locked by lever type latches or fixed by screws.

However, the method of coupling the connector by screws has a drawback in that it takes a long time and it is difficult to tighten and loosen the screws. Moreover, the method does not have an effect to push out the mounting/dismounting unit of the connector. Further, the lever used in the lever type latch is necessarily made large in size and the operation area thereof is increased to provide a sufficient push out effect. As a result, there is a strong need for an I/O module capable of being arranged in a small space at a high density, with the connector unit thereof being preferably small in size and light in weight.

SUMMARY OF THE INVENTION

Taking the above into consideration, a first object of the present invention is to provide an I/O module having a small and light connector unit capable of being easily mounted and dismounted.

Another object of the present invention is to provide an I/O module of safety wherein a charged portion of a terminal block is not exposed to a surface.

Still another object of the present invention is to provide an I/O module having an outside surface without wirings exposed thereon thereby to further enhance safety in consideration of the present state that a terminal block and many exposed wirings connected thereto give a very complicated appearance, particularly when many I/O modules are mounted at a high density, and they may cause an accident due to human error.

To solve the above problems, in accordance with the present invention, there is provided an I/O module composed of a fixed unit provided with a box having opposite sides parallel each other, a plurality of connection terminals disposed on a surface perpendicular to the opposite sides of the box and an LED display module unit disposed on a surface parallel to the surface on which the connection terminals are disposed and a mounting/dismounting unit having a terminal block including connection terminals capable of being engaged with the connection terminals of the fixed unit having a hinge disposed on one end of the mounting/dismounting unit, a pin provided with the fixed unit and capable of being engaged with the hinge and a grip provided with the mounting/dismounting unit and capable of being accommodated therein, wherein the grip is pulled out to a position to be used and then further pulled out, whereby the mounting/dismounting unit is moved, drawing an arc about the pin and separated from the fixed unit.

Further, lever type latches may be disposed on a side opposite to the pin of the connector of the fixed unit to enable the mounting/dismounting unit to be more easily separated and locked. Since the lever type latch having a small pushing out effect sufficiently suffices for this purpose, the size thereof can be small.

Furthermore, a case having a door is preferably provided with the mounting/dismounting unit including the terminal block. Since the lever may have a small size, as described above, the mounting/dismounting unit can be accommodated in the case.

In addition, when the connection terminals of the mounting/dismounting unit are engaged with the connection terminals of the fixed unit, the opposite sides of the case are preferably flush with the corresponding sides of the box of the fixed unit, respectively, and the outside of the door of the case is preferably flush with the surface of the LED display module unit of the fixed unit at the closed position of the door.

The wirings are fixed on the terminal block by screws and pulled out to the outside from under the case. When a wiring job is completed, the door can be closed. To remove the mounting/dismounting unit, the door is opened and the grip is picked out to this side, then further pulled out and then the hinge is separated from the pin.

BRIEF DESCRIPTION OF THE DRAWINGS

FIG. 1 is a perspective view showing an input/output module according to the present invention and a back panel to which the input/output module is detachably coupled;

FIG. 4(a) is a fragmentary view showing pivotal movement of the latching lever of the input/output module of FIG. 1;

FIG. 7 is an enlarged perspective view of the input/output module of FIG. 1;

FIG. 8 is a rear view of the connector assembly;

FIG. 9 is a front view of the input/output module with the connector assembly removed;

FIG. 10 is a top view of the connector assembly; and

FIG. 11 is a top view of the connector assembly with the pull tab deployed and the door open.

DETAILED DESCRIPTION OF THE PREFERRED EMBODIMENTS

Figure 2:
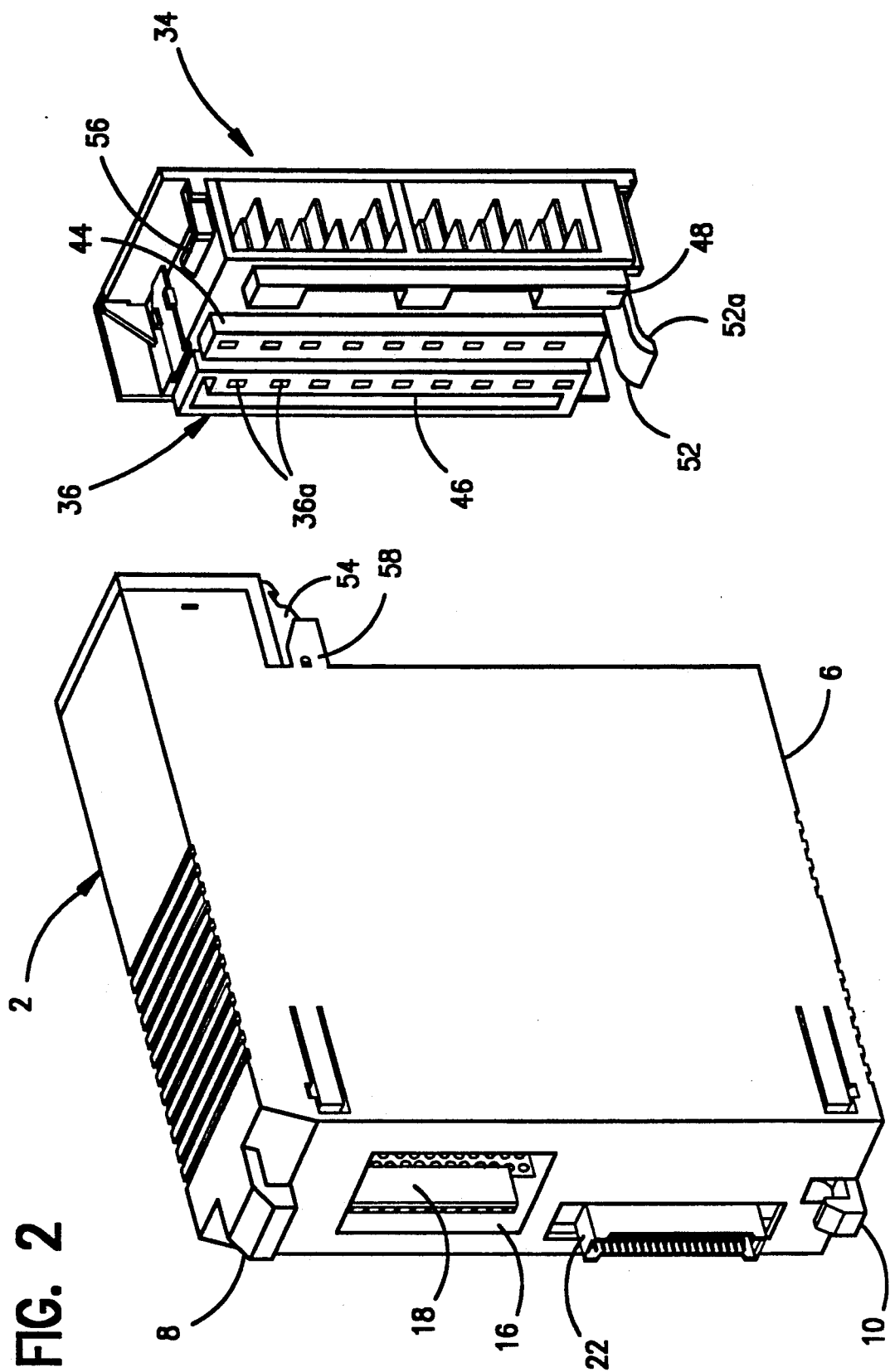
FIG. 2 is an enlarged, reverse angle perspective view of the input/output module of FIG. 1 with a connector assembly separated.

FIG. 1 is a perspective view of an I/O module 2 and a back panel 4 of a programmable control (P.C.) to which the module 2 is detachably coupled. FIG 2 is an enlarged, reverse angle view with a connector assembly 34 separated from the input/output module 2. The module 2 has a generally rectangular box-shaped housing which includes a rearward end to which the back panel 4 is coupled and a forward end. The rearward end includes outwardly projecting arms 8 and 10 (illustrated in FIG. 2) which grip corresponding sockets 12 and 14 of the back panel 4 of the P.C. Arm 10 is formed on the end of a pivotal lever 11 (illustrated in FIGS. 4 and 5) to facilitate connection and disconnection with the back panel 4.

The housing contains a circuit board 16 having a plurality of circuit components mounted thereon including IC chip 18. The circuit board is electrically coupled to the PC through a socket connector 20 of the back panel 4 and a plug connector 22 of the module 2 which has pins inserted in corresponding sockets of the connector 20 when the module 2 is connected to the back panel 4.

Figure 3:
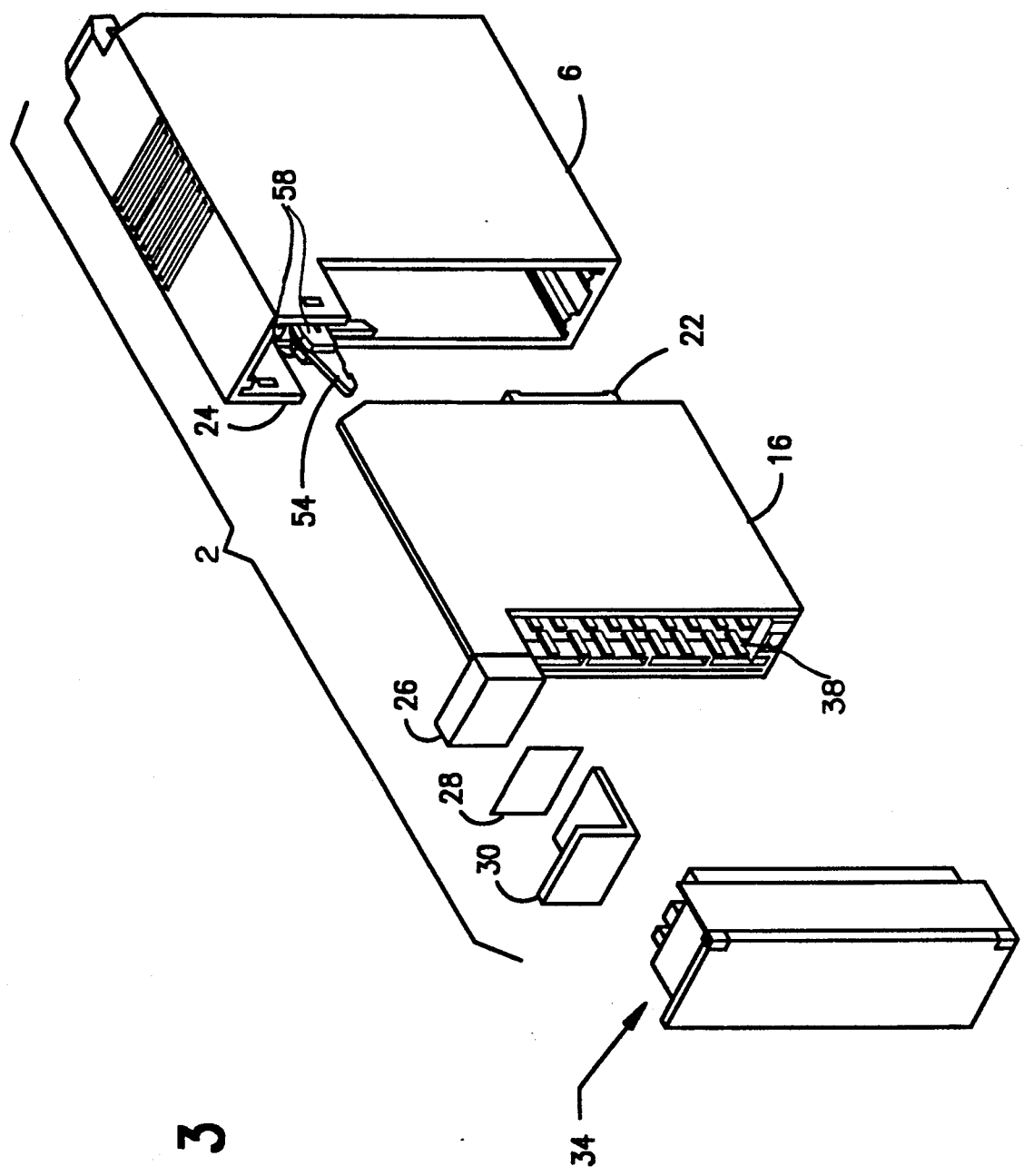
FIG. 3 is an exploded view of the input/output module of FIG. 1.

As illustrated in FIG. 3, the forward end of the housing 6 has a cantilever portion 24 in which an LED display module 26 of the circuit board is positioned. When assembled, a film 28 and a protective cap 30 are attached to the front surface of the LED display module 26 to form an LED assembly 32. When the circuit board 16 is mounted in the housing 6, the assembly 32 fits in and over the front of the cantilever portion 24 of the housing.

With reference primarily to FIGS. 2, 4, 6 and 6(a), a detachable connector assembly 34 provides a mounting-/dismounting unit and is mounted under the cantilever portion 24 of the housing 6 at the forward end thereof. The connector assembly 34 includes a terminal block 36 having connection terminals constituting a plurality of sockets 36a which receive connector pins 38 of the circuit board 16. The pins are arranged in two vertical columns to be mated with the two vertical columns of sockets 36a. The sockets 36a are electrically coupled to terminal screws 40 (illustrated in FIGS. 4 and 6(a), which are then connected to appropriate wiring (not shown). A door 42 covering the terminal screws 40 can be provided with wiring information on the outside surface and a logic circuit pattern on the inside, for example, to indicate which wires should be connected to which terminal screws 40. The door is pivotable on hinges provided at one side and latched closed by a catch 43 at the other side. The sockets 36a are provided in insulated material, such as plastic, formed as two vertical bars 44 and 46. A third vertical bar 48 does not contain sockets, but provides an extra measure of insulation and protection against electric shock by persons mounting and/or dismounting the assembly 34. Moreover, the bar 48 enhances the mechanical connection between the housing 6 and the connector assembly 34 by providing a slight interference fit between the bar 48 and a correspondingly shaped recess 50 (illustrated in FIG. 7) formed in front of the housing. Preferably, the terminal block 36 is a single molded plastic piece in which all of the bars are integrally formed.

Figure 4:
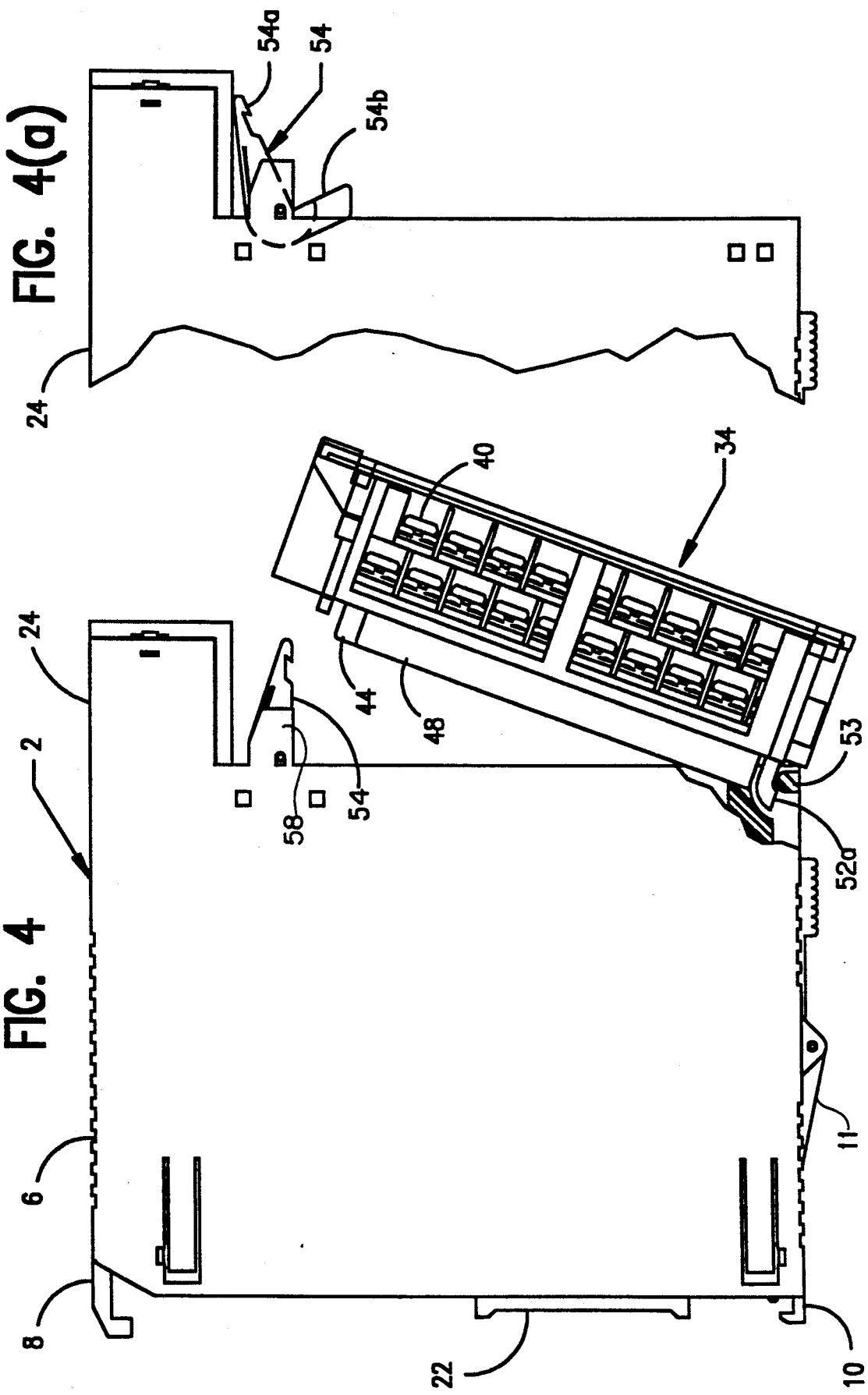
FIG. 4 is a side elevational view, partially cut-away, of the input/output module of FIG. 1 with the connector assembly in an intermediate position.
Figure 5:
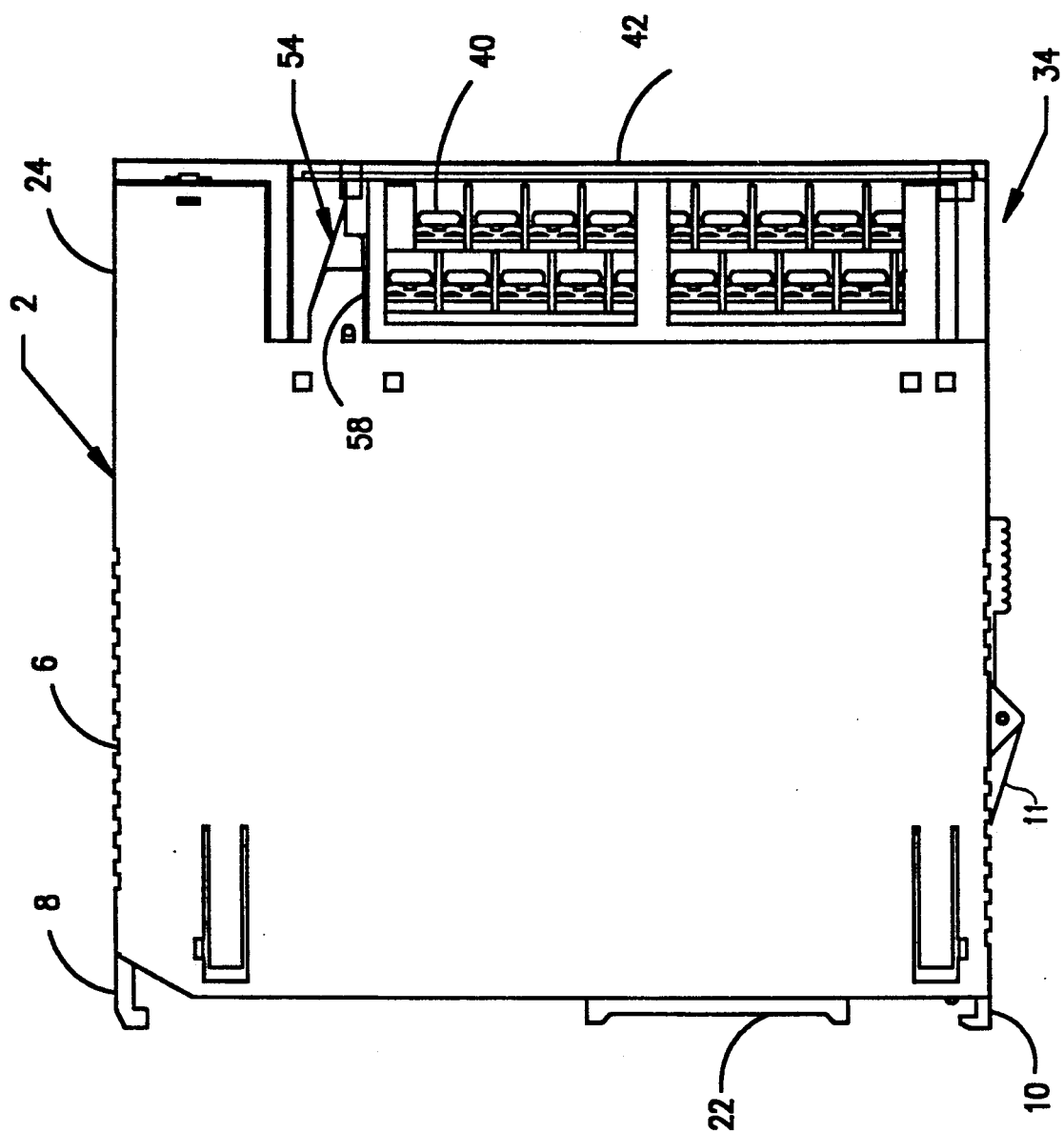
FIG. 5 is a side elevational view of the input/output module of FIG. 1, with the connector assembly in a connected position.
Figure 6A:
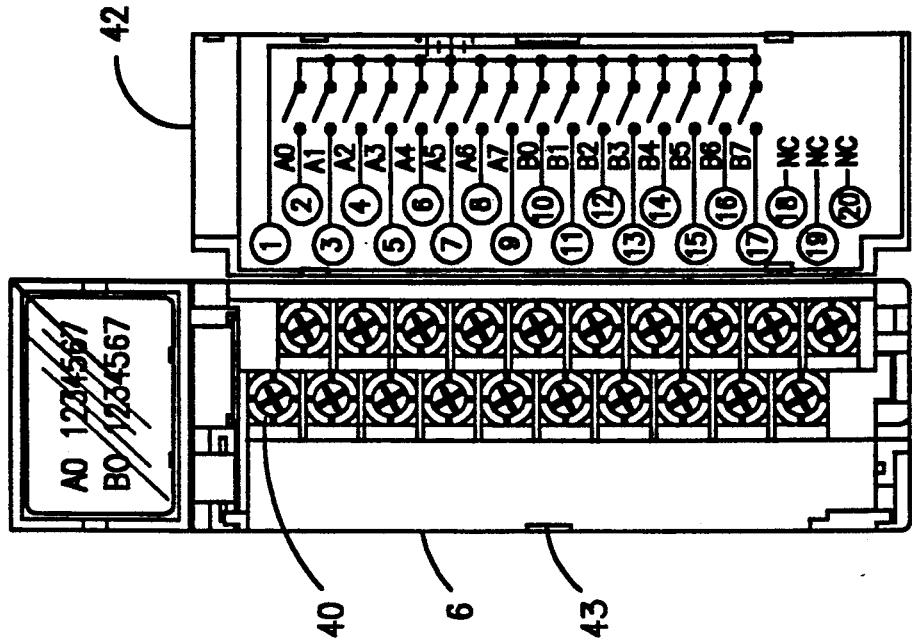
FIG. 6(a) is a front view of the input/output module with the door open.
Figure 6:
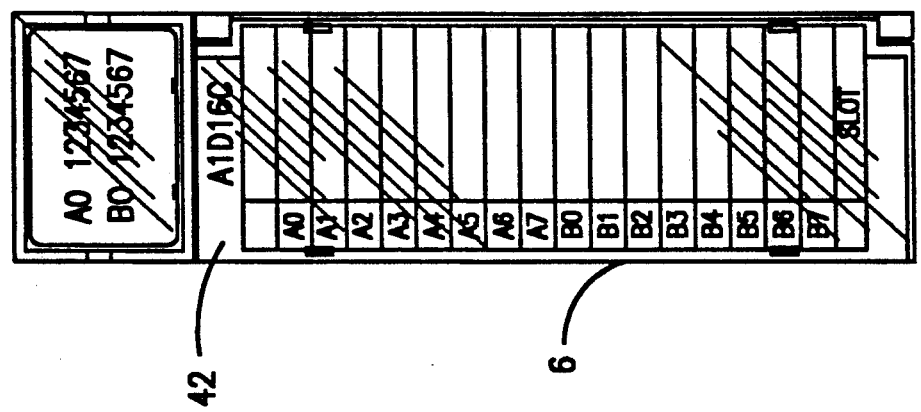
FIG. 6 is a front view of the input/output module of FIG. 1.

As illustrated in FIGS. 2, 4 and 7, the terminal block 36 includes a medial, bottom hinge 52 which has a downwardly-turned distal end portion 52a. The hinge 52 may be integrally formed with the terminal block 36. A pivot pin 53 is disposed transversely in the housing 6 at the forward end thereof to engage the hinge 52 when placing the connector assembly 34 into the housing 6 to connect the pins 38 and sockets 36a.

As shown primarily in FIG. 4, to connect the connector assembly 34 to the housing 6 and thus make electrical connection between the pins and sockets of the circuit board and the terminal block 36, respectively, the connector assembly 34 is tilted away from the cantilever portion 24 so that the curved end of the hinge 52 fits in a space between pivot pin 53 and the housing 6. When the assembly 34 approaches a vertical position, a lever 54 pivotally mounted in the upper portion of the housing 6 under the cantilever portion 24 pivots downwards to latch. The lever 54 is shaped like a bell crank having a first portion 54a and a second portion 54b integrally formed and disposed substantially at a right angle to each other. The first portion 54a has a hook which catches a lug 56 formed on the terminal block 36, thereby securing the terminal block 36 in front of the housing 6 under the cantilever portion 24. The lever 54 is pivotally mounted between a pair of support arms 58 (both illustrated in FIG. 3.) which are preferably integrally formed as part of the housing 6. With reference to FIG. 7, a connection unit 60 supports the pins 38 and is connected to the circuit board 16, which is then mounted in the housing 6 so that the connector unit 6 faces outwardly from an open end of the housing 6.

The second portion 54b of the lever 54 is used to pry the assembly 34 outwardly when separating the assembly 34 from the housing 6 by lifting up on the first portion 54a. The lower portion 54b pushes against the terminal block and helps moves the assembly away from the housing.

As illustrated in FIGS. 10 and 11, at the top of the assembly 34, a pull tab 62 is slidably mounted between guides 64 and 66 which are formed on top of the terminal block 36 on opposite sides of the tab 62. To remove the assembly 34 from the housing 6, the door 42 is at first opened. Then, the first portion 54a of the lever 54 (not shown in FIGS. 10 and 11) is pushed upwardly to disengage the lug 56. The second portion 54b of the lever 54 pushes the assembly 34 outwardly by pivoting on the support arms 58. Next, the pull tab 62 is pulled outwardly to an extended position; illustrated in FIG. 11, and then the pull tab 62 is used as a grip to pull and thereby pivot the assembly 34 outwardly, whereby the pins 38 separate from the sockets 36a. After pivoting through an arc of less than 90°, the hinge 52 will separate from the pin 53.

The housing 6 is preferably made of molded plastic, as are the terminal block 36 and the connection unit 60. When the assembly 34 is mounted in the front of the housing 6 with the pins 38 and sockets 36a interconnected, the opposite sides of the housing 6 are flush with corresponding sides of the assembly 34, and the door 42 in a closed, position is flush with the LED display module 26.

Variations of the embodiments described herein can include switching the position of the pins 38 and sockets 36a so that either the pin side or the socket side can be formed on either the connection unit 60 or the terminal block 36.

As described above, according to the present invention, the connector assembly 34 of the I/O module can be made small in size and light in weight and easily mounted and dismounted.

Further, since the charged portion of the terminal block 36 is not exposed, safety is enhanced. Furthermore, since the outside appearance of the I/O module is made flat without irregularity, it can be easily handled and maintained and a colored label or the like can be attached on the surface of the door 42.

What is claimed is:

1. An I/O module for a programmable control device, comprising:
 a housing having a first end, a second end, and two parallel opposite sides;
 a circuit board disposed inside the housing;
 first electrical connector means, disposed at the first end of the housing, for electrically connecting the programmable control device to the circuit board;
 a mounting/dismounting unit having a hinge and a grip on opposite sides of the mounting/dismounting unit and a terminal block to which signal wires are to be connected; and
 second electrical connector means, disposed at the second end of the housing, for electrically connecting the circuit board to the terminal block;
 a pivot pin disposed on the second end of the housing adjacent one of the sides thereof and being engaged with the hinge when the mounting/dismounting unit is mounted on the housing, whereby a force exerted outwardly from said housing on the grip on the mounting/dismounting imparts pivotal movement about said pivot pin and away from the housing until the hinge and said pivot pin disengage from each other after pivoting through a predetermined arc;
 mounting means for mounting said mounting/dismounting unit on said housing, said mounting means including latch means disposed at the second end of the housing opposite said pivot pin, for holding the mounting/dismounting unit in the mounted position, said latch means including an L-shaped lever, having a first arm engaging the mounting/dismounting unit in the mounted position, a second arm forcing the mounting/dismounting unit outwards from the housing when the first arm is raised to release the mounting/dismounting unit and a pivot point where the first and second arms meet.

* * * * *

UNITED STATES PATENT AND TRADEMARK OFFICE
CERTIFICATE OF CORRECTION

PATENT NO. : 5,253,140
DATED : October 12, 1993
INVENTOR(S) : Inoue et al.

It is certified that error appears in the above-indentified patent and that said Letters Patent is hereby corrected as shown below:

Cover Page, in the title, "HHAVING" should be --HAVING--;

On cover page, insert the following:

--[23] PCT Filed: PCT/JP89/00221....Mar. 2, 1989--.

Col. 1, line 4, "HHAVING" should be --HAVING--.

Signed and Sealed this

Third Day of May, 1994

Attest:

Attesting Officer

BRUCE LEHMAN

Commissioner of Patents and Trademarks